(12) United States Patent
Taguchi

(10) Patent No.: US 6,800,379 B2
(45) Date of Patent: Oct. 5, 2004

(54) COMPOUND HAVING PYRROLE RING AND LIGHT-EMITTING DEVICE COMPRISING SAME

(75) Inventor: Toshiki Taguchi, Kanagawa-ken (JP)

(73) Assignee: Fuji Photo Film Co., Ltd., Kanagawa-ken (JP)

( * ) Notice: Subject to any disclaimer, the term of this patent is extended or adjusted under 35 U.S.C. 154(b) by 93 days.

(21) Appl. No.: 09/965,818

(22) Filed: Oct. 1, 2001

(65) Prior Publication Data

US 2002/0041979 A1 Apr. 11, 2002

(30) Foreign Application Priority Data

Sep. 29, 2000 (JP) ........................................ 2000-300716

(51) Int. Cl.$^7$ ............................ B32B 19/00; H01J 1/62; H01J 63/04; H01L 29/06; H01L 35/24; C08F 126/06; C08F 126/08; C07D 209/82

(52) U.S. Cl. ..................... 428/690; 428/917; 313/504; 313/505; 257/40; 526/259; 526/263; 548/440

(58) Field of Search ................ 428/690, 917; 313/504, 505; 257/40; 526/259, 263; 548/440

(56) References Cited

U.S. PATENT DOCUMENTS

| | | | | |
|---|---|---|---|---|
| 5,281,489 A | * | 1/1994 | Mori et al. | 428/690 |
| 6,165,729 A | * | 12/2000 | Leland et al. | 435/7.1 |
| 6,249,085 B1 | * | 6/2001 | Arai | 313/506 |
| 6,395,328 B1 | * | 5/2002 | May | 427/66 |
| 6,461,747 B1 | * | 10/2002 | Okada et al. | 428/690 |

FOREIGN PATENT DOCUMENTS

JP 60-156745 * 8/1985

OTHER PUBLICATIONS

Baldo et al., Very high–efficiency green organic light–emitting devices based on electrophosphorescence, Jul. 5, 1999, Applied Physics Letters, vol. 75, No. 1.*
Tang, C.W., et al., "Organic electroluminescent diodes," Appl. Phys. Lett. 51 (12) p. 913–915, Sep. 21, 1987.

* cited by examiner

Primary Examiner—Cynthia H. Kelly
Assistant Examiner—Camie Thompson
(74) Attorney, Agent, or Firm—Sughrue Mion, PLLC

(57) ABSTRACT

A compound represented by the following general formula (1) and a light-emitting device comprising the compound.

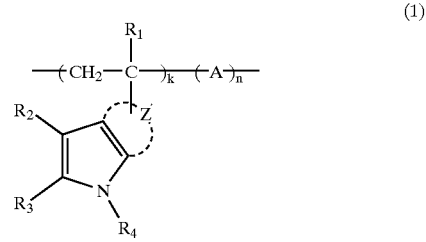

(1)

In the general formula (1), $R_1$ represents a hydrogen atom or a methyl group; $R_2$ and $R_3$ independently represent a hydrogen atom or a substituent and may bond together to form a ring; $R_4$ represents a hydrogen atom or a substituent selected from the group consisting of alkyl groups, alkenyl groups, alkynyl groups, aryl groups, heterocyclic groups, alkylcarbonyl groups, arylcarbonyl groups, alkylsulfonyl groups, arylsulfonyl groups, alkoxycarbonyl groups, aryloxycarbonyl groups, carbamoyl groups and sulfamoyl groups; Z represents an atomic group forming an aromatic ring; A represents a comonomer unit; and k and n each represent a mole fraction, k being 1 to 100 (%), n being 0 to 99 (%), and the sum of k and n is 100 (%).

7 Claims, No Drawings

COMPOUND HAVING PYRROLE RING AND LIGHT-EMITTING DEVICE COMPRISING SAME

BACKGROUND OF THE INVENTION

The present invention relates to a compound having a pyrrole ring and a light-emitting device comprising the compound.

Recently, various display devices have been widely studied. In particular, light-emitting devices including organic EL devices are advantageous in that they can emit light with high luminance by lowered applying voltage, whereby much attention has been paid thereto.

For example, a light-emitting device comprising organic thin layers, which are provided by vapor-depositing organic compounds, has been disclosed in Applied Physics Letters, 51, 913 (1987). This light-emitting device has a structure where an electron-transporting layer and a hole-transporting layer are laminated between electrodes, to exhibit more excellent light-emitting properties than that of conventional devices having a single-layer structure. In this light-emitting device, N,N'-di-m-tolyl-N,N'-diphenylbenzidine (TPD) is used as a hole-transporting material for the hole-transporting layer. TPD is a typical example of triarylamine derivatives known as an effective hole-transporting material. However, the triarylamine derivatives are generally high in crystallinity, whereby light-emitting devices using the derivatives are generally poor in durability during storage and driving. Further, although the organic thin layers are desirably provided by a coating method from viewpoints of simplification of production processes, improvement of workability, increasing the light-emitting device in size, etc., the triarylamine derivatives is poor in solubility in an organic solvent to be not suitable for the coating method. Additionally, the inventor has found that light-emitting devices comprising polymerized triarylamine derivatives exhibit insufficient light-emitting properties.

Under such a circumstance, research is in progress for light-emitting devices using nitrogen-containing heterocyclic compounds such as a carbazole derivative instead of the triarylamine derivatives as the hole-transporting material. For example, various low molecular weight carbazole derivatives and poly-N-vinylcarbazole derivatives usable as the hole-transporting material are disclosed in Preprints of the 6th Seminar on Molecular Electronics and Bioelectronics Subcommittee of The Japan Society of Applied Physics, 1997. However, the light-emitting devices using such a hole-transporting material are poor in light-emitting efficiency and require high applying voltage for light emission.

OBJECT AND SUMMARY OF THE INVENTION

An object of the present invention is to provide a compound usable for a light-emitting device that can emit light with high luminance and excellent light-emitting efficiency, and a light-emitting device comprising the compound.

As a result of intense research in view of the above object, the inventor has found that a light-emitting device using a particular compound having a pyrrole ring emits light with high luminance and excellent light-emitting efficiency. The present invention has been accomplished by the finding.

Thus, a compound of the present invention is represented by the following general formula (1):

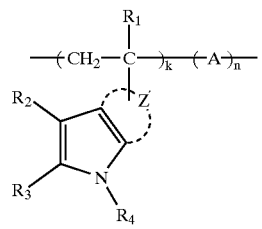

(1)

wherein $R_1$ represents a hydrogen atom or a methyl group; $R_2$ and $R_3$ independently represent a hydrogen atom or a substituent and may bond together to form a ring; $R_4$ represents a hydrogen atom or a substituent selected from the group consisting of alkyl groups, alkenyl groups, alkynyl groups, aryl groups, heterocyclic groups, alkylcarbonyl groups, arylcarbonyl groups, alkylsulfonyl groups, arylsulfonyl groups, alkoxycarbonyl groups, aryloxycarbonyl groups, carbamoyl groups and sulfamoyl groups; Z represents an atomic group forming an aromatic ring; A represents a comonomer unit; and k and n each represent a mole fraction, k being 1 to 100 (%), n being 0 to 99 (%), and the sum of k and n is 100 (%).

In the compound of the present invention, A in the general formula (1) is preferably derived from a comonomer selected from the group consisting of styrene, α-methylstyrene, butadiene, vinyl acetate, vinyl carbazole, acrylic acid, methacrylic acid, acrylic esters, methacrylic esters, acrylamide and methacrylamide. The aromatic ring formed by Z is particularly preferably a benzene ring. The compound preferably has a weight-average molecular weight (Mw) of 1,000 to 10,000,000.

It is particularly preferred that the compound of the present invention is further represented by the following general formula (2):

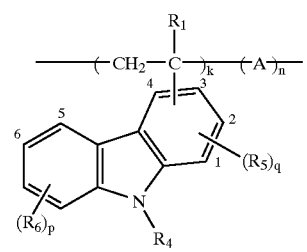

(2)

wherein $R_1$ represents a hydrogen atom or a methyl group; $R_4$ represents a hydrogen atom or a substituent selected from the group consisting of alkyl groups, alkenyl groups, alkynyl groups, aryl groups, heterocyclic groups, alkylcarbonyl groups, arylcarbonyl groups, alkylsulfonyl groups, arylsulfonyl groups, alkoxycarbonyl groups, aryloxycarbonyl groups, carbamoyl groups and sulfamoyl groups; $R_5$ and $R_6$ independently represent a substituent; p represents an integer of 1 to 4; q represents an integer of 1 to 3; A represents a comonomer unit; and k and n independently represent a mole fraction, k being 1 to 100 (%), n being 0 to 99 (%), and the sum of k and n is 100 (%).

In the compound represented by the general formula (2), a carbon atom having $R_1$ preferably bonds to 3-position of a carbazole ring.

A light-emitting device of the present invention comprises a pair of electrodes and one or more organic layers disposed therebetween, wherein at least one of the organic layers comprises the above-mentioned compound of the present invention. Weight ratio of the compound is preferably 0.01 to 99.9 weight % based on the total weight of the organic layer comprising the compound. It is preferable that at least one of the organic layers is provided by a coating method. Further, at least one of the organic layers preferably comprises a light-emitting material that utilizes a triplet exciton for light emission, and the light-emitting material is preferably an iridium complex.

DETAILED DESCRIPTION OF THE PREFERRED EMBODIMENTS

[1] Compound Having Pyrrole Ring

A compound of the present invention having a pyrrole ring is represented by the following general formula (1). The compound represented by the general formula (1) is hereinafter referred to as "compound (1)."

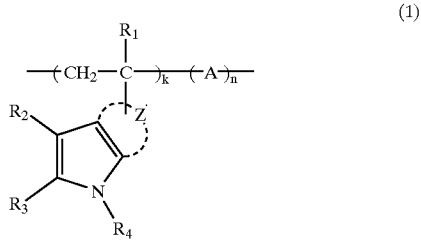

(1)

In the general formula (1), $R_1$ represents a hydrogen atom or a methyl group. $R_2$ and $R_3$ independently represent a hydrogen atom or a substituent. $R_2$ and $R_3$ may bond together to form a ring.

Examples of the substituents represented by $R_2$ and $R_3$ include: halogen atoms such as a fluorine atom, a chlorine atom, a bromine atom and an iodine atom; a cyano group; a sulfo group; a formyl group; a carboxyl group; alkyl groups, the number of carbon atom thereof being preferably 1 to 30, more preferably 1 to 15, such as a methyl group, a t-butyl group and a cyclohexyl group; alkenyl groups, the number of carbon atoms thereof being preferably 2 to 30, more preferably 2 to 15, such as a vinyl group, a 1-propenyl group, a 1-buten-2-yl group and a cyclohexen-1-yl group; alkynyl groups, the number of carbon atoms thereof being preferably 2 to 30, more preferably 2 to 15, such as an ethynyl group and a I-propynyl group; aryl groups, the number of carbon atoms thereof being preferably 6 to 30, more preferably 6 to 15, such as a phenyl group, a tolyl group, a xylyl group, a naphtyl group, a biphenylyl group and a pyrenyl group; heterocyclic groups preferably having a 5- or 6-membered ring structure, which may condense with the other ring and may have such a hetero atom as a nitrogen atom, a oxygen atom, a sulfur atom, etc., the number of carbon atoms thereof being preferably 2 to 30, more preferably 2 to 15, such as a pyridyl group, a piperidyl group, an oxazolyl group, an oxadiazolyl group, a tetrahydrofliryl group and a thienyl group; amino groups including unsubstituted amino group, monoalkylamino groups, monoarylamino groups, dialkylamino groups, diarylamino groups, alkylarylamino groups, monoheterocyclicamino groups, bisheterocyclicamino groups, etc., the number of carbon atom thereof being preferably 1 to 30, more preferably 1 to 16, being preferably a bis-substituted amino group such as a dimethylamino group, a diphenylamino group and a phenylnaphtylamino group; imino groups including $-CR_{11}=NR_{12}$ and $-N=CR_{13}R_{14}$, in which $R_{11}$ to $R_{14}$ independently represent a hydrogen atom, an alkyl group, an aryl group, a heterocyclic group, an alkoxy group, an aryloxy group or a substituted or unsubstituted amino group, the number of carbon atom thereof being preferably 1 to 30, more preferably 1 to 15; alkoxy groups, the number of carbon atom thereof being preferably 1 to 30, more preferably 1 to 15, such as a methoxy group, an ethoxy group and a cyclohexyloxy group; aryloxy groups, the number of carbon atoms thereof being preferably 6 to 30, more preferably 6 to 15, such as a phenoxy group, a 1-naphthoxy group and a 4-phenylphenoxy group; alkylthio groups, the number of carbon atom thereof being preferably 1 to 30, more preferably 1 to 15, such as a methylthio group, an ethylthio group and a cyclohexylthio group; arylthio groups, the number of carbon atoms thereof being preferably 6 to 30, more preferably 6 to 15, such as a phenylthio group and a tolylthio group; carbonamide groups, the number of carbon atom thereof being preferably 1 to 30, more preferably 1 to 15, such as an acetamide group, a benzoylamide group and an N-methylbenzoylamide group; sulfonamide groups, the number of carbon atom thereof being preferably 1 to 30, more preferably 1 to 15, such as a methane sulfonamide group, a benzene sulfonamide group and ap-toluene sulfonamide group; carbamoyl groups, the number of carbon atom thereof being preferably 1 to 30, more preferably 1 to 15, such as a unsubstituted carbamoyl group, a methylcarbamoyl group, a dimethylcarbamoyl group, a phenylcarbamoyl group, a diphenylcarbamoyl group and a dioctylcarbamoyl group; sulfamoyl groups, the number of carbon atom thereof being preferably 1 to 30, more preferably 1 to 15, such as a unsubstituted sulfamoyl group, a methylsulfamoyl group, a dimethylsulfamoyl group, a phenylsulfamoyl group, a diphenylsulfamoyl group and a dioctylsulfamoyl group; alkylcarbonyl groups, the number of carbon atoms thereof being preferably 2 to 30, more preferably 2 to 15, such as an acetyl group, a propionyl group, a butyroyl group and a lauroyl group; arylcarbonyl groups, the number of carbon atoms thereof being preferably 6 to 30, more preferably 6 to 15, such as a benzoyl group and a naphthoyl group; alkylsulfonyl groups, the number of carbon atoms thereof being preferably 1 to 30, more preferably 1 to 15, such as a methane sulfonyl group and an ethane sulfonyl group; arylsulfonyl groups, the number of carbon atoms thereof being preferably 6 to 30, more preferably 6 to 15, such as a benzene sulfonyl group, a p-toluene sulfonyl group and a 1-naphthalene sulfonyl group; alkoxycarbonyl groups, the number of carbon atoms thereof being preferably 2 to 30, more preferably 2 to 15, such as a methoxycarbonyl group, an ethoxycarbonyl group and a butoxycarbonyl group; aryloxycarbonyl groups, the number of carbon atoms thereof being preferably 6 to 30, more preferably 6 to 15, such as a phenoxycarbonyl group and a 1-naphthoxycarbonyl group; alkylcarbonyloxy groups, the number of carbon atoms thereof being preferably 2 to 30, more preferably 2 to 15, such as an acetoxy group, a propionyloxy group and a butyroyloxy group; arylcarbonyloxy groups, the number of carbon atoms thereof being preferably 6 to 30, more preferably 6 to 15, such as a benzoyloxy group and a 1-naphthoyloxy group; urethane groups, the number of carbon atom thereof being preferably 1 to 30, more preferably 1 to 15, such as a methoxycarbonamide group, a phenoxycarbonamide group and a methylaminocarbonamide group; ureide groups, the number of carbon atom thereof being preferably 1 to 30, more preferably 1 to 15, such as a methylaminocarbonamide group, a dimethylaminocarbonamide group and a diphenylaminocarbonamide group; carbonate groups, the number of carbon atom thereof being preferably 1 to 30, more preferably 1 to 15, such as a methoxycarbonyloxy group and a phenoxycarbonyloxy group; silyl groups, the number of carbon atom thereof being preferably 1 to 30, more preferably 1 to 15, such as a trimethylsilyl group, a triphenylsilyl group and a triethylsilyl group; etc.

$R_2$ and $R_3$ are preferably an alkyl group, respectively. It is also preferable that $R_2$ and $R_3$ bond together to form an aromatic ring.

In the general formula (1), $R_4$ represents a hydrogen atom or a substituent selected from the group consisting of: alkyl groups, the number of carbon atom thereof being preferably 1 to 30, more preferably 1 to 15, such as a methyl group, t-butyl group and a cyclohexyl group; alkenyl groups, the number of carbon atoms thereof being preferably 2 to 30, more preferably 2 to 15, such as a vinyl group, a 1-propenyl group, a 1-buten-2-yl group and a cyclohexen-1-yl group; alkynyl groups, the number of carbon atoms thereof being preferably 2 to 30, more preferably 2 to 15, such as an ethynyl group and a 1-propynyl group; aryl groups, the number of carbon atoms thereof being preferably 6 to 30, more preferably 6 to 15, such as a phenyl group, a tolyl group, a xylyl group, a naphtyl group, a biphenylyl group and a pyrenyl group; heterocyclic groups preferably having a 5-or 6-membered ring structure, which may condense with the other ring and may have such a hetero atom as a nitrogen atom, a oxygen atom, a sulfur atom, etc., the number of carbon atoms thereof being preferably 2 to 30, more preferably 2 to 15, such as a pyridyl group, a piperidyl group, an oxazolyl group, an oxadiazolyl group, a tetrahydrofuryl group and a thienyl group; alkylcarbonyl groups, the number of carbon atoms thereof being preferably 2 to 30, more preferably 2 to 15, such as an acetyl group, a propionyl group, a butyroyl group and a lauroyl group; arylcarbonyl groups, the number of carbon atoms thereof being preferably 6 to 30, more preferably 6 to 15, such as a benzoyl group and a naphthoyl group; alkylsulfonyl groups, the number of carbon atom thereof being preferably 1 to 30, more preferably 1 to 15, such as a methane sulfonyl group and an ethane sulfonyl group; arylsulfonyl groups, the number of carbon atoms thereof being preferably 6 to 30, more preferably 6 to 15, such as a benzene sulfonyl group, a p-toluene sulfonyl group and a 1-naphthalene sulfonyl group; alkoxycarbonyl groups, the number of carbon atoms thereof being preferably 2 to 30, more preferably 2 to 15, such as a methoxycarbonyl group, an ethoxycarbonyl group and a butoxycarbonyl group; aryloxycarbonyl groups, the number of carbon atoms thereof being preferably 6 to 30, more preferably 6 to 15, such as a phenoxycarbonyl group and a 1-naphthoxycarbonyl group; carbamoyl groups, the number of carbon atom thereof being preferably 1 to 30, more preferably 1 to 15, such as a unsubstituted carbamoyl group, a methylcarbamoyl group, a dimethylcarbamoyl group, a phenylcarbamoyl group, a diphenylcarbamoyl group and a dioctylcarbamoyl group; and sulfamoyl groups, the number of carbon atom thereof being preferably 1 to 30, more preferably 1 to 15, such as a unsubstituted sulfamoyl group, a methylsulfamoyl group, a dimethylsulfamoyl group, a phenylsulfamoyl group, a diphenylsulfamoyl group and a dioctylsulfamoyl group. These groups may further have a substituent.

In the general formula (1), Z represents an atomic group forming an aromatic ring that may contain a hetero atom. The aromatic ring is preferably a benzene ring, a naphthalene ring, an anthracene ring, pyridine ring or a pyrazine ring, particularly preferably a benzene ring.

$R_2$, $R_3$ and Z may further have a substituent, and examples of the substituent include: halogen atoms such as a fluorine atom, a chlorine atom, a bromine atom and an iodine atom; a cyano group; a sulfo group; a formyl group; a carboxyl group; alkyl groups, the number of carbon atom thereof being preferably 1 to 30, more preferably 1 to 15, such as a methyl group, a t-butyl group and a cyclohexyl group; alkenyl groups, the number of carbon atoms thereof being preferably 2 to 30, more preferably 2 to 15, such as a vinyl group, a 1-propenyl group, a 1-buten-2-yl group and a cyclohexen-1-yl group; alkynyl groups, the number of carbon atoms thereof being preferably 2 to 30, more preferably 2 to 15, such as an ethynyl group and a 1-propynyl group; aryl groups, the number of carbon atoms thereof being preferably 6 to 30, more preferably 6 to 15, such as a phenyl group, a tolyl group, a xylyl group, a naphtyl group, a biphenylyl group and a pyrenyl group; heterocyclic groups preferably having a 5-or 6-membered ring structure, which may condense with the other ring and may have such a hetero atom as a nitrogen atom, a oxygen atom, a sulfur atom, etc., the number of carbon atoms thereof being preferably 2 to 30, more preferably 2 to 15, such as a pyridyl group, a piperidyl group, an oxazolyl group, an oxadiazolyl group, a tetrahydrofuiryl group and a thienyl group; amino groups including unsubstituted amino group, monoalkylamino groups, monoarylamino groups, dialkylamino groups, diarylamino groups, alkylarylamino groups, monoheterocyclicamino groups, bisheterocyclicamino groups, etc., the number of carbon atom thereof being preferably 1 to 30, more preferably 1 to 16, being preferably a bis-substituted amino group such as a dimethylamino group, a diphenylamino group and a phenylnaphtylamino group; imino groups including $-CR_{11}=NR_{12}$ and $-N=CR_{13}R_{14}$, in which $R_{11}$ to $R_{14}$ independently represent a hydrogen atom, an alkyl group, an aryl group, a heterocyclic group, an alkoxy group, an aryloxy group or a substituted or unsubstituted amino group, the number of carbon atom thereof being preferably 1 to 30, more preferably 1 to 15; alkoxy groups, the number of carbon atom thereof being preferably 1 to 30, more preferably 1 to 15, such as a methoxy group, an ethoxy group and a cyclohexyloxy group; aryloxy groups, the number of carbon atoms thereof being preferably 6 to 30, more preferably 6 to 15, such as a phenoxy group, a 1-naphthoxy group and a 4-phenylphenoxy group; alkylthio groups, the number of carbon atom thereof being preferably 1 to 30, more preferably 1 to 15, such as a methylthio group, an ethylthio group and a cyclohexylthio group; arylthio groups, the number of carbon atoms thereof being preferably 6 to 30, more preferably 6 to 15, such as a phenylthio group and a tolylthio group; carbonamide groups, the number of carbon atom thereof being preferably 1 to 30, more preferably 1 to 15, such as an acetamide group, a benzoylamide group and an N-methylbenzoylamide group; sulfonamide groups, the number of carbon atom thereof being preferably 1 to 30, more preferably 1 to 15, such as a methane sulfonamide group, a benzene sulfonamide group and a p-toluene sulfonamide group; carbamoyl groups, the number of carbon atom thereof being preferably 1 to 30, more preferably 1 to 15, such as a unsubstituted carbamoyl group, a methylcarbamoyl group, a dimethylcarbamoyl group, a phenylcarbamoyl group, a diphenylcarbamoyl group and a dioctylcarbamoyl group; sulfamoyl groups, the number of carbon atom thereof being preferably 1 to 30, more preferably 1 to 15, such as a unsubstituted sulfamoyl group, a methylsulfamoyl group, a dimethylsulfamoyl group, a phenylsulfamoyl group, a diphenylsulfamoyl group and a dioctylsulfamoyl group; alkylcarbonyl groups, the number of carbon atoms thereof being preferably 2 to 30, more preferably 2 to 15, such as an acetyl group, a propionyl group, a butyroyl group and a lauroyl group; arylcarbonyl groups, the number of carbon atoms thereof being preferably 6 to 30, more preferably 6 to 15, such as a benzoyl group and a naphthoyl group; alkylsulfonyl groups, the number of carbon atom thereof being preferably 1 to 30, more preferably 1 to 15, such as a methane sulfonyl group and an ethane sulfonyl group; arylsulfonyl groups, the number of carbon atoms thereof being preferably 6 to 30, more preferably 6 to 15, such as a benzene sulfonyl group, ap-toluene sulfonyl group and a 1-naphthalene sulfonyl group; alkoxycarbonyl groups, the number of carbon atoms thereof being preferably 2 to 30, more preferably 2 to 15, such as a methoxycarbonyl group, an ethoxycarbonyl group and a butoxycarbonyl group; aryloxycarbonyl groups, the number of carbon atoms thereof being preferably 6 to 30, more preferably 6 to 15, such as a phenoxycarbonyl group and a 1-naphthoxycarbonyl group; alkylcarbonyloxy groups, the number of carbon atoms thereof being preferably 2 to 30, more preferably 2 to 15, such as an acetoxy group, a propionyloxy group and a butyroyloxy group; arylcarbonyloxy groups, the number of carbon atoms thereof being preferably 6 to 30, more preferably 6 to 15, such as a benzoyloxy group and a 1-naphthoyloxy group; urethane groups, the number of carbon atom thereof being preferably 1 to 30, more preferably 1 to 15, such as a methoxycarbonamide group, a phenoxycarbonamide group and a methylaminocarbonamide group; ureide groups, the number of carbon atom thereof being preferably 1 to 30, more preferably 1 to 15, such as a methylaminocarbonamide group, a dimethylaminocarbonamide group and a diphenylaminocarbonamide group; carbonate groups, the number of carbon atom thereof being preferably 1 to 30, more preferably 1 to 15, such as a methoxycarbonyloxy group and a phenoxycarbonyloxy group; silyl groups, the number of carbon atom thereof being preferably 1 to 30, more preferably 1 to 15, such as a trimethylsilyl group, a triphenylsilyl group and a triethylsilyl group; etc.

In the general formula (1), A represents a comonomer unit, and k and n each represent a mole fraction, k being 1 to 100 (%), n being 0 to 99 (%), and the sum of k and n is 100 (%). Thus, the compound (1) may be a copolymer that has the comonomer unit represented by A or a homopolymer without the comonomer unit. In the case where the compound (1) is a copolymer having the comonomer unit represented by A, the copolymer may be a random copolymer or a block copolymer. The comonomer unit represented by A may be derived from a comonomer such as vinyl monomer, etc., and as the comonomer for A may be used only one kind of monomer or a plurality of kinds of monomers. The comonomer unit represented by A is preferably derived from a comonomer selected from the group consisting of styrene, α-methylstyrene, butadiene, vinyl acetate, vinyl carbazole, acrylic acid, methacrylic acid, acrylic esters, methacrylic esters, acrylamide, methacrylamide and monomers derived by bonding a functional group thereto.

It is particularly preferable that the pyrrole ring, $R_2$, $R_3$ and Z in the general formula (1) form a carbazole ring. Thus, the compound (1) of the present invention is particularly preferably represented by the following general formula (2).

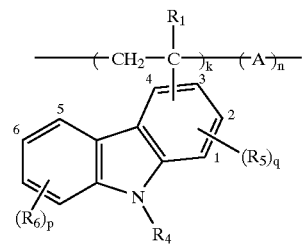

$R_1$, $R_4$, A, k and n in the general formula (2) have the same meanings and the same preferred embodiments as those in the above-mentioned general formula (1), respectively. $R_5$ and $R_6$ independently represent a substituent with examples being the same as those of the above-mentioned substituent on $R_2$, $R_3$ and Z. Further, p represents an integer of 1 to 4 and q represents an integer of 1 to 3. Suitably, in the compound represented by the general formula (2), the carbon atom to which $R_1$ is attached is preferably bonded to the 3-or 6-position of the carbazole ring.

The compound (1) of the present invention may be prepared by a usual polymerization method such as a radical polymerization method and an ionic polymerization method. Of the methods, preferred are a radical polymerization method and a cationic polymerization method. The polymerization methods are disclosed in Takayuki Otsu and Masaetsu Kinoshita, "Kobunshi Gosei no Jikkenho (Experimental Techniques for Polymer Synthesis)", Kagaku Dojin, 1972, etc. Weight-average molecular weight (Mw) of the compound (1) is preferably 1,000 to 10,000,000, more preferably 2,000 to 1,000,000, particularly preferably 5,000 to 500,000.

Although the compound (1) of the present invention may be used as a hole-injecting material, a hole-transporting material, a light-emitting material, an electron-transporting material, an electron-injecting material, etc. for a light-emitting device, the compound (1) is preferably used as a hole-injecting material, a hole-transporting material or a light-emitting material. The compound (1) may be used for an organic layer of a light-emitting device singly or in combination with another organic material or an inorganic material. The organic material used with the compound (1) may be a low molecular weight compound or a high molecular weight compound. The compound (1) and another polymer may be laminated in a light-emitting device. Further, the compound (1) and a low molecular weight compound may be mixed or laminated to be used for a light-emitting device. In the case of laminating the compound (1) and the low molecular weight compound, the low molecular weight compound may be mixed and applied with a polymer binder, or laminated by a vacuum deposition, sputtering, etc.

Specific examples H-1 to H-32 of the compound (1) according to the present invention will be illustrated below without intention of restricting the scope of the present invention defined by the claims attached hereto. Incidentally, in each of the structural formulae of the specific examples, the numbers shown at lower-right of parentheses in polymer main chain represent a mole fraction (%) of a monomer, respectively.

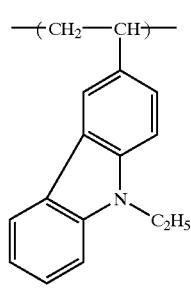
Mw = 24000
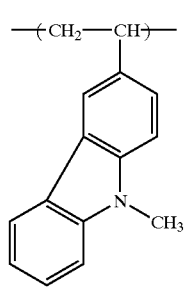
Mw = 19000
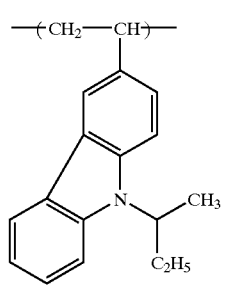
Mw = 17000
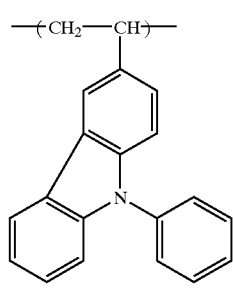
Mw = 27000
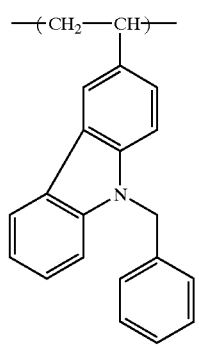
Mw = 29000
H-1
H-2
H-3
H-4
H-5
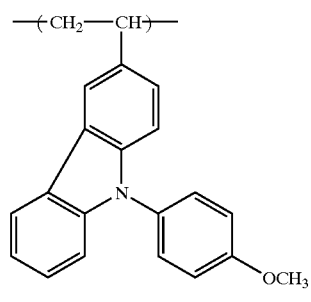
Mw = 19000
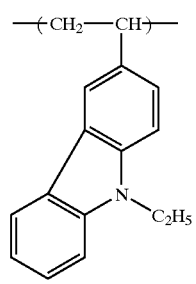
Mw = 120000
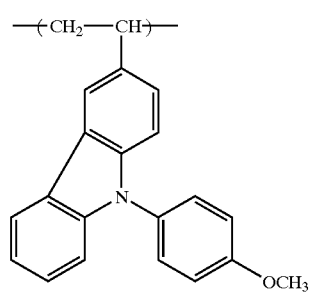
Mw = 230000
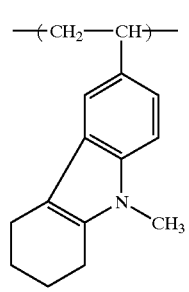
Mw = 14000
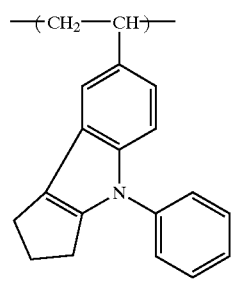
Mw = 21000
H-6
H-7
H-8
H-9
H-10

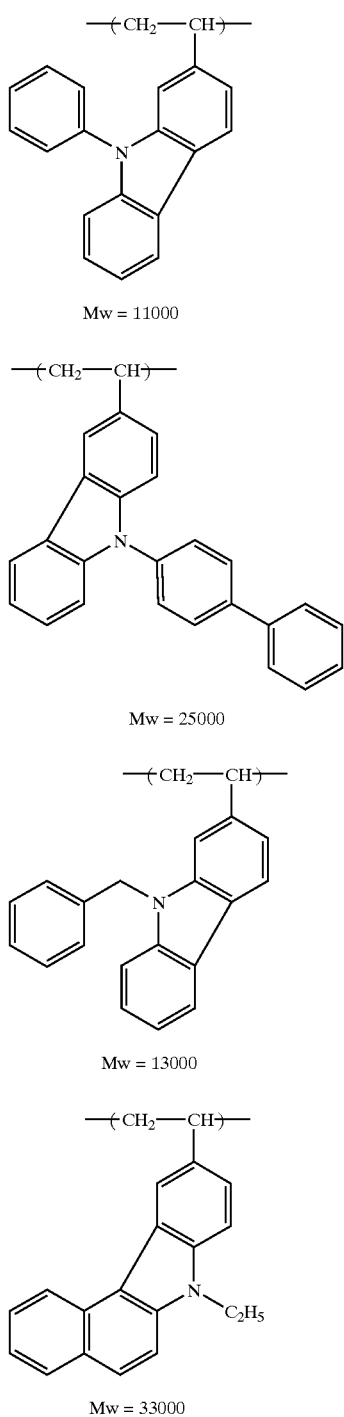
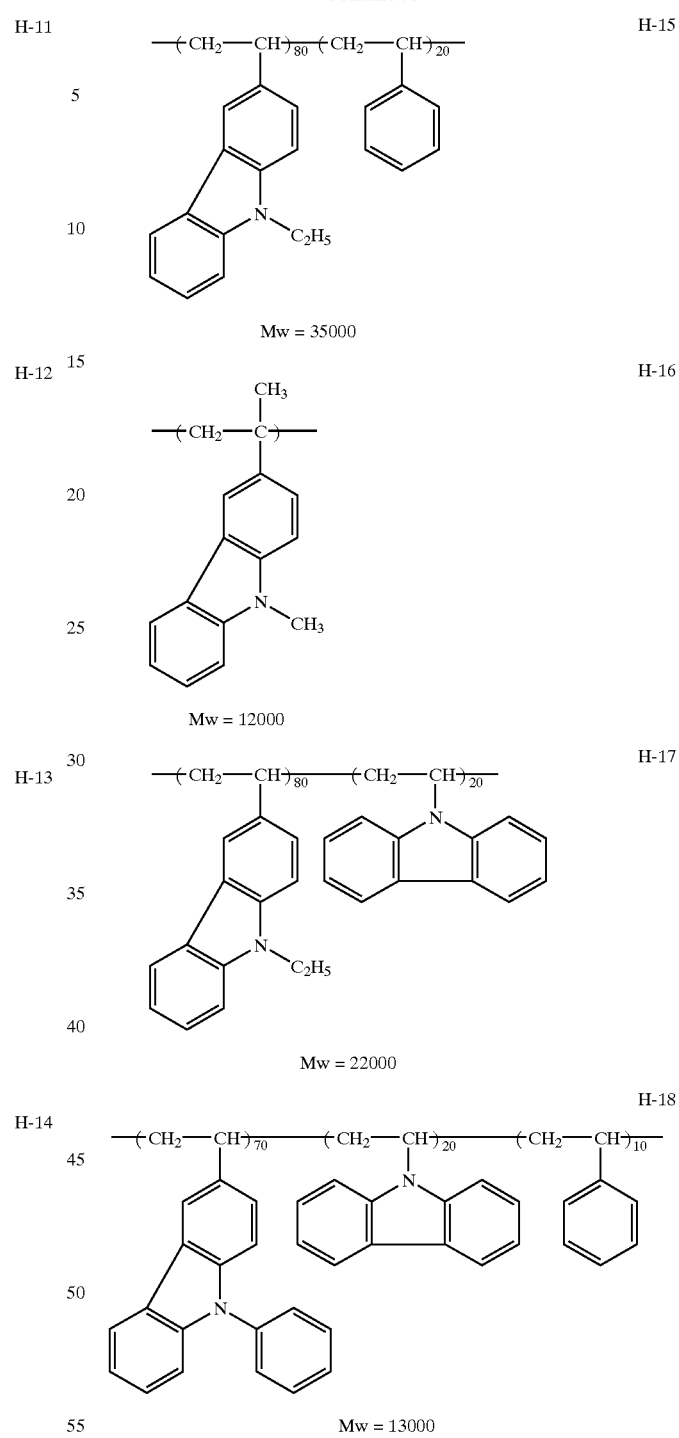

-continued
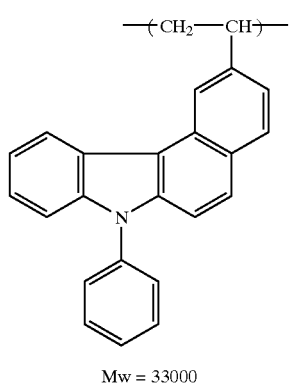
Mw = 33000
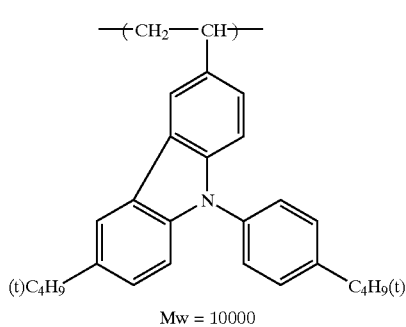
Mw = 10000
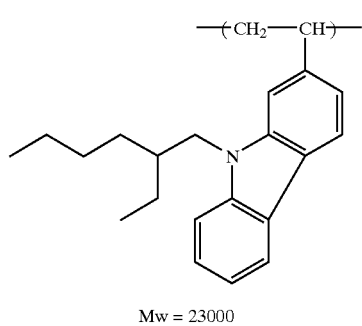
Mw = 23000
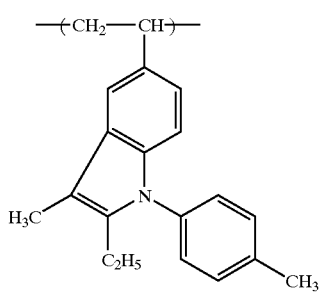
Mw = 19000
-continued
H-19
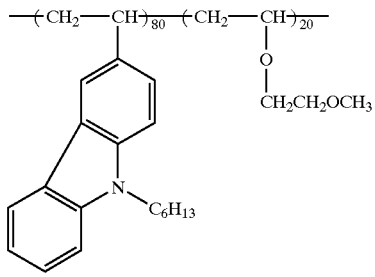
Mw = 33000
H-20
H-21
H-22
H-23
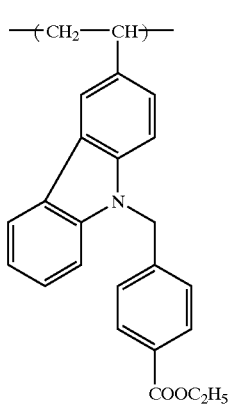
Mw = 29000
H-24
H-25
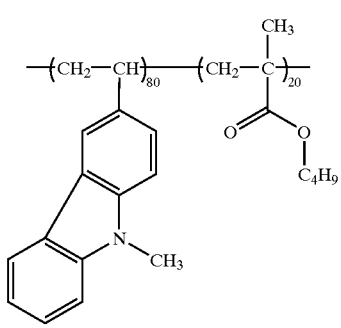
Mw = 13000
H-26
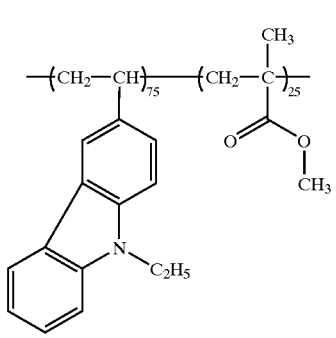
Mw = 29000

H-27
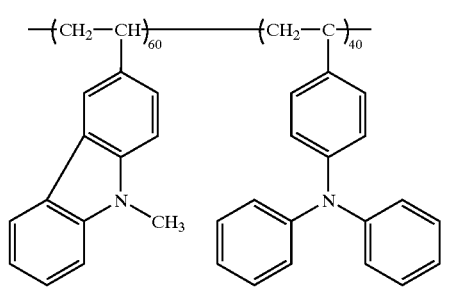
Mw = 23000

H-28
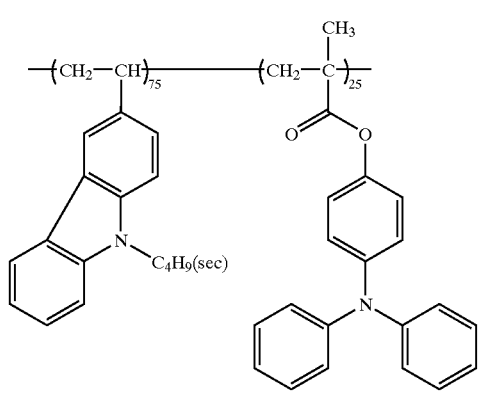
Mw = 21000

H-29
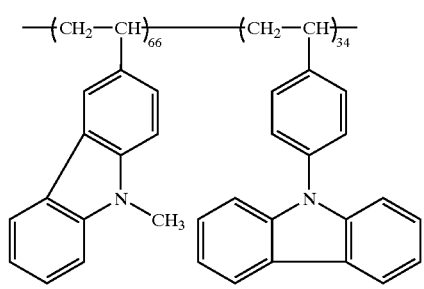
Mw = 34000

H-30
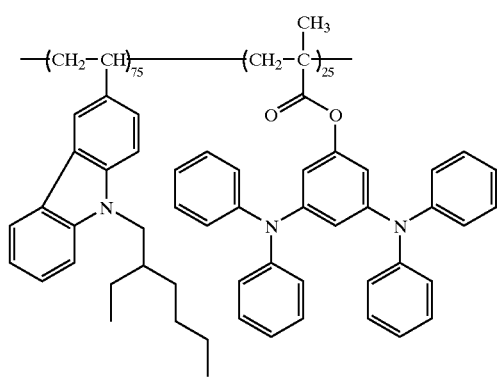
Mw = 17000

H-31
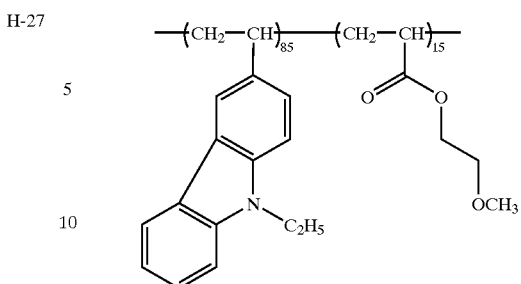
Mw = 11000

H-32
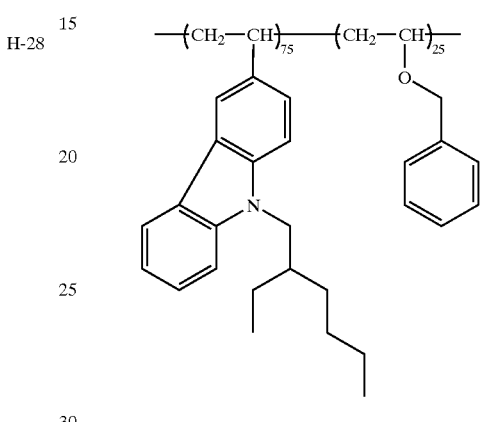
Mw = 130000

[2] Light-Emitting Device

A light-Emitting device of the present invention comprises a pair of electrodes (a positive electrode and a negative electrode) and one or more organic layers including a light-emitting layer disposed therebetween. At least one of the organic layers comprises the above-mentioned compound (1) of the present invention. The organic layer comprising the compound (1) may be disposed by a resistance heating vapor deposition method, an electron beam method, a sputtering method, a molecular stacking method, a coating method, an ink-jet method, etc. Among the methods, preferred are the resistance heating vapor deposition method and the coating method from the viewpoints of simplification of production processes and properties of the light-emitting device.

The light-emitting device may have a hole-injecting layer, a hole-transporting layer, a light-emitting layer, an electron-injecting layer, an electron-transporting layer, protective layer, etc. as the organic layer. These layers may have a plurality of functions. It is preferable that at least one of the organic layers is provided by a coating method. Although the compound (1) may be contained in any of the organic layers, the compound (1) is preferably used for the hole-injecting layer, the hole-transporting layer or the light-emitting layer. Weight ratio of the compound (1) is preferably 0.01 to 99.9 weight %, more preferably 0.1 to 99 weight % based on the total weight of the organic layer comprising the compound (1). Each component of the light-emitting device according to the present invention will be described in detail below.

(a) Positive Electrode

The positive electrode acts to supply holes to the hole-injecting layer, the hole-transporting layer, the light-emitting layer, etc. The positive electrode may be made of a metal, an alloy, a metal oxide, an electrically conductive compound, a mixture thereof, etc., preferably made of a material having a work function of 4.0 eV or more. Specific examples of a material for the positive electrode include: metals such as gold, silver, chromium and nickel; electrically conductive metal oxides such as tin oxide, zinc oxide, indium oxide and ITO (Indium Tin Oxide); mixtures and laminations of the metal and the electrically conductive metal oxide; electrically conductive inorganic compounds such as copper iodide and copper sulfide; electrically conductive organic compounds such as polyaniline, polythiophene and polypyrrole; laminations of the electrically conductive organic compound and ITO; etc. Among the materials, preferred are the electrically conductive metal oxides, particularly preferred is ITO from the viewpoints of productivity, electroconductivity, transparency, etc.

Method for disposing the positive electrode is not particularly limited and may be selected depending on the material used therefor. For example, the positive electrode made of ITO may be disposed by an electron beam method, a sputtering method, a resistance heating vapor deposition method, a chemical reaction method such as a sol-gel method, a coating method using a dispersion containing indium tin oxide, etc.

The positive electrode may be subjected to a washing treatment, etc., to lower the driving voltage, or to increase the light-emitting efficiency of the light-emitting device. For example, the positive electrode made of ITO is preferably subjected to a UV-ozone treatment or a plasma treatment. Sheet resistance of the positive electrode is preferably a few hundred Ω/square or less. Although thickness of the positive electrode may be appropriately selected depending on the material used therefor, generally, the thickness is preferably 10 nm to 5 $\mu$m, more preferably 50 nm to 1 $\mu$m, particularly preferably 100 to 500 nm.

The positive electrode is generally disposed on a substrate made of a soda lime glass, a non-alkali glass, a transparent resin, etc. The glass substrate is preferably made of the non-alkali glass to reduce ion elution. In the case of using the soda lime glass, the substrate is preferably coated with silica, etc. beforehand. Thickness of the substrate is not particularly limited if only it has sufficient strength. In the case of glass substrate, the thickness is generally 0.2 mm or more, preferably 0.7 mm or more.

(b) Negative Electrode

The negative electrode acts to supply electrons to the electron-injecting layer, the electron-transporting layer, the light-emitting layer, etc. Material for the negative electrode may be selected from metals, alloys, metal halides, metal oxides, electrically conductive compounds, mixtures thereof, etc.
correspondingly to ionization potential, stability, adhesion property with a layer adjacent to the negative electrode such as the light-emitting layer, etc. Specific examples of the material for the negative electrode include: alkali metals such as Li, Na, K and Cs and fluorides thereof; alkaline earth metals such as Mg and Ca, and fluorides thereof, gold; silver; lead; aluminum; alloys and mixtures of sodium and potassium; alloys and mixtures of lithium and aluminum; alloys and mixtures of magnesium and silver; rare earth metals such as indium and ytterbium; etc. The negative electrode is preferably made of a material having a work function of 4.0 eV or less, more preferably made of aluminum, a lithium-aluminum alloy, a magnesium-silver alloy or a mixture thereof.

The negative electrode may have a single-layer structure or a multi-layer structure. The negative electrode may be disposed by an electron beam method, a sputtering method, a resistance heating vapor deposition method, a coating method, etc. A plurality of metals may be simultaneously deposited. The negative electrode of an alloy may be disposed by simultaneously depositing a plurality of metals, or by depositing an alloy. Sheet resistance of the negative electrode is preferably a few hundred Ω/square or less. Although thickness of the negative electrode may be appropriately selected depending on the material used therefor, generally, the thickness is preferably 10 nm to 5 $\mu$m, more preferably 50 nm to 1 $\mu$m, particularly preferably 100 nm to 1 $\mu$m.

(c) Hole-Injecting Layer and Hole-Transporting Layer

The hole-injecting material and the hole-transporting material used for the hole-injecting layer and the hole-transporting layer are not particularly limited if they have any function of: injecting the holes provided from the positive electrode into the light-emitting layer; transporting the holes to the light-emitting layer; and blocking the electrons provided from the negative electrode. Examples of the hole-injecting material and the hole-transporting material include carbazole derivatives, triazole derivatives, oxazole derivatives, oxadiazole derivatives, imidazole derivatives, polyarylalkane derivatives, pyrazoline derivatives, pyrazolone derivatives, phenylenediamine derivatives, arylamine derivatives, amino-substituted chalcone derivatives, styrylanthracene derivatives, fluorenone derivatives, hydrazone derivatives, stilbene derivatives, silazane derivatives, aromatic tertiary amine compounds, styrylamine compounds, aromatic dimethylidyne compounds, porphyrin compounds, polysilane compounds, poly(N-vinylcarbazole) derivatives, aniline copolymers, electrically conductive polymers and oligomers such as oligothiophenes and polythiophenes, mixtures thereof, etc.

Each of the hole-injecting layer and the hole-transporting layer may have a single-layer structure or a multi-layer structure. In the case where the light-emitting device comprises a plurality of the hole-injecting layers or the hole-transporting layers, the plurality of layers may be made of the same material or different materials. The hole-injecting layer and the hole-transporting layer may be disposed by a vacuum deposition method, an LB method, an ink-jet method, a coating method using a solution or a dispersion containing the above material such as a spin-coating method, a casting method and a dip-coating method, etc.

The solution and the dispersion used in the coating method may contain a resin. Examples of the resin include poly(vinyl chloride), polycarbonates, polystyrene, poly (methyl methacrylate), poly(butyl methacrylate), polyesters, polysulfones, poly(phenylene oxide), polybutadiene, poly (N-vinylcarbazole), hydrocarbon resins, ketone resins, phenoxy resins, polyamides, ethyl celluloses, poly(vinyl acetate), ABS resins, polyurethanes, melamine resins, unsaturated polyester resins, alkyd resins, epoxy resins, silicone resins, etc. Although thickness of each of the hole-injecting layer and the hole-transporting layer is not particularly limited, generally, the thickness is preferably 1 nm to 5 $\mu$m, more preferably 5 nm to 1 $\mu$m, particularly preferably 10 to 500 nm.

(d) Light-Emitting Layer

In the light-emitting layer, holes injected from the positive electrode, the hole-injecting layer or the hole-transporting layer and electrons injected from the negative electrode, the electron-injecting layer or the electron-transporting layer are recombined to emit light when electric field is applied to the light-emitting device. The above-mentioned compound (1) may be used as a light-emitting material for the light-emitting layer. Further, examples of the light-emitting material used in this invention include: benzoxazole derivatives; benzoimidazole derivatives; benzothiazole derivatives; styrylbenzene derivatives; polyphenyl derivatives; diphenylbutadiene derivatives; tetraphenylbutadiene derivatives; naphthalimido derivatives; coumarin derivatives; perylene derivatives; perynone derivatives; oxadiazole derivatives; aldazine derivatives; pyralidine derivatives; cyclopentadiene derivatives; bis(styryl)anthracene derivatives; quinacridon derivatives; pyrrolopyridine derivatives; thiadiazolopyridine derivatives; styrylamine derivatives; aromatic dimethylidine compounds; metal complexes such as 8-quinolinol metal complexes and derivatives thereof and rare-earth metal complexes; light-emitting polymer material such as polythiophene, polyphenylene and polyphenylenevinylene; etc.

In the light-emitting device of the present invention, the light-emitting material may be such that utilizes a singlet exciton, a triplet exciton or both of the singlet exciton and the triplet exciton for light emission. In the case of using the compound (1) of the present invention for the light-emitting layer, it is preferable that a light-emitting material utilizing the triplet exciton for light emission is used in combination with the compound (1).

Transition metal complexes are preferably used as the light-emitting material that utilizes the triplet exciton for light emission. Central metal atom of the transition metal complex is preferably an iridium atom or a platinum atom, more preferably an iridium atom. Further, among the transition metal complexes, more preferred are ortho-metallation complexes. Thus, ortho-metallation complexes containing iridium atom are particularly preferred.

The iridium complex used in this invention as the light-emitting material utilizing the triplet exciton may be such as described in: H. Yersin, "Photochemistry and Photophysics of Coordination Compounds", Springer-Verlag, Inc. (1987); Akio Yamamoto, "Yukikinzoku-Kagaku, Kiso to Oyo (Metalorganic Chemistry, Foundation and Application)", Shokabo Publishing Co., Ltd., (1982); etc.

The iridium complex may have a monodentate ligand and/or a multidentate ligand such as a bidentate ligand. Preferred examples of the ligand include: halogen ligands such as a chlorine ligand; nitrogen-containing heterocyclic ligands such as a phenylpyridine ligand, a benzoquinoline ligand, a quinolinol ligand, a bipyridyl ligand and a phenanthroline ligand; diketone ligands such as an acetylacetone ligand; carboxylic acid ligands; and a $PF_6$ ligand. Of these, more preferred are diketone ligands. The iridium complex may have only one kind of ligand, or two or more kinds of ligands. The iridium complex preferably has one or two kind of ligand, particularly preferably has only one kind of ligand.

Although the iridium complex may be a neutral complex having no charges or an ionic complex containing a counter ion such as $Cl^-$, $PF_6^-$, $ClO_4^-$, etc., the iridium complex is preferably a neutral complex.

The iridium atom in the iridium complex is preferably trivalent, although valence of the iridium atom is not particularly limited. The iridium complex may be a mononuclear complex containing only one iridium atom or a multinuclear complex containing a plurality of iridium atoms. The iridium complex is preferably a mononuclear complex. Though the iridium complex may contain another metal atom in addition to the iridium atom, it is preferable that the complex contains no metal atom other than the iridium atom as the central metal.

Tris-ortho-metalated complex of iridium (III) with 2-phenylpyridine ($Ir(ppy)_3$) is known as an specific example of the iridium complex that utilizes the triplet exciton for light emission. A green light-emitting device using $Ir(ppy)_3$ exhibits a high external quantum efficiency of 8%, which exceeds that of the conventional light-emitting device, 5% (Applied Physics Letters, 75, 4 (1999)).

The light-emitting layer may be disposed by: a resistance heating vapor deposition method; an electron beam method; a sputtering method; a molecular stacking method; a coating method such as a spin-coating method, a casting method and a dip-coating method; an LB method; an ink-jet method; etc. Among the methods, the resistance heating vapor deposition method and the coating method are preferred. Although thickness of the light-emitting layer is not particularly limited, generally, the thickness is preferably 1 nm to 5 $\mu$m, more preferably 5 nm to 1 $\mu$m, particularly preferably 10 to 500 nm.

(e) Electron-Injecting Layer and Electron-Transporting Layer

The electron-injecting material and the electron-transporting material used for the electron-injecting layer and the electron-transporting layer are not particularly limited if they have any function of: injecting the electrons provided from the negative electrode into the light-emitting layer; transporting the electrons to the light-emitting layer; and blocking the holes provided from the positive electrode. Examples of the electron-injecting material and the electron-transporting material include: triazole derivatives; oxazole derivatives; oxadiazole derivatives; fluorenone derivatives; anthraquinodimethane derivatives; anthrone derivatives; diphenylquinone derivatives; thiopyran dioxide derivatives; carbodimide derivatives; fluorenylidenemethane derivatives; distyrylpyrazine derivatives; anhydrides derived from a heterocyclic tetracarboxylic acid having such a structure as naphthalene and perylene; phthalocyanine derivatives; metal complexes such as 8-quinolinol metal complexes and derivatives thereof, metallophthalocyanines, and metal complexes containing a benzoxazole ligand or a benzothiazole ligand; etc.

Each of the electron-injecting layer and the electron-transporting layer may have a single-layer structure or a multi-layer structure. In the case where the light-emitting device comprises a plurality of the electron-injecting layers or the electron-transporting layers, the plurality of layers may be made of the same material or different materials. The electron-injecting layer and the electron-transporting layer may be disposed by a vacuum deposition method, an LB method, an ink-jet method, a coating method using a solution or a dispersion containing the above material such as a spin-coating method, a casting method and a dip-coating method, etc. The solution and the dispersion used in the coating method may contain a resin. Examples of the resin include poly(vinyl chloride), polycarbonates, polystyrene, poly(methyl methacrylate), poly(butyl methacrylate), polyesters, polysulfones, poly(phenylene oxide), polybutadiene, poly(N-vinylcarbazole), hydrocarbon resins, ketone resins, phenoxy resins, polyamides, ethyl celluloses, poly(vinyl acetate), ABS resins, polyurethanes, melamine resins, unsaturated polyester resins, alkyd resins, epoxy resins, silicone resins, etc. Although thickness of each of the electron-injecting layer and the electron-transporting layer is not particularly limited, generally, the thickness is preferably 1 nm to 5 $\mu$m, more preferably 5 nm to 1 $\mu$m, particularly preferably 10 to 500 nm.

(f) Protective Layer

The protective layer acts to shield the light-emitting device from penetration of moisture, oxygen, etc. that promotes deterioration of the device. Examples of a material for the protective layer include: metals such as In, Sn, Pb, Au, Cu, Ag, Al, Ti and Ni; metal oxides such as MgO, SiO, $SiO_2$, $Al_2O_3$, GeO, NiO, CaO, BaO, $Fe_2O_3$, $Y_2O_3$ and $TiO_2$; metal fluorides such as $MgF_2$, LiF, $AlF_3$ and $CaF_2$; polyethylene; polypropylene; poly(methylmethacrylate); polyimides; polyureas; polytetrafluoroethylene; polychlorotrifluoroethylene; polydichlorodifluoroethylene; a copolymer of chlorotrifluoroethylene and dichlorodifluoroethylene; copolymers of tetrafluoroethylene and at least one comonomer; fluorine-containing copolymers having a cyclic structure in the main chain; a moisture-absorbing substance having a water absorption of 1% or more; a moisture-resistant substance having a water absorption of 0.1% or less; etc.

The protective layer may be disposed by a vacuum deposition method, a sputtering method, an activated sputtering method, a molecular beam epitaxy method (MBE method), a cluster ion beam method, an ion-plating method, a plasma polymerization method, a high frequency excitation ion-plating method, a plasma CVD method, a laser CVD method, a thermal CVD method, a gas source CVD method, a coating method, an ink-jet method, etc.

EXAMPLES

The present invention will be explained in further detail by the following examples without intention of restricting the scope of the present invention defined by the claims attached hereto.

1. Synthesis of Compound (1)

The compound (1) according to the present invention can be easily synthesized by a usual polymerization method such as a radical polymerization method and an ionic polymerization method. Synthesis of the compound H-1 shown above as an example of the compound (1) will be described below.

A three-necked flask having an inner volume of 500 ml equipped with a thermometer and a reflux condenser was charged with 22.3 g (0.1 mol) of N-ethylcarbazole-3-carboxaldehyde, 39 g (0.11 mol) of methyltriphenyl phosphonium bromide and 150 ml of N,N-dimethylformamide. This mixture was cooled by an ice-methanol bath to −5° C. under nitrogen gas stream while stirring the mixture by a magnetic stirring bar. To the mixture was gradually added 30 ml of 28% sodium methoxide methanol solution dropwise while maintaining the temperature of the mixture below 5° C. Then, the resultant mixture was stirred for 1 hour at 10° C., stirred for 2 hours at room temperature, poured into 3 L of cold water to deposite a crude solid, and filtered to obtain the crude solid. The crude solid was washed with water and dried, and the residue was purified by a silica gel column chromatography (dissolution medium: hexane/ethyl acetate=5/1). The dissolution medium was distilled off from the fraction containing the desired product and the resultant oil was subjected to crystallization using iso-propanol, to obtain 21 g of N-ethyl-3-vinylcarbazole as a crystal.

A three-necked flask having an inner volume of 300 ml equipped with a thermometer and a reflux condenser was dried under dry nitrogen gas stream, and charged with 5 g of N-ethyl-3-vinylcarbazole and 100 ml of dichloromethane. This mixture was stirred by a magnetic stirring bar to completely dissolve N-ethyl-3-vinylcarbazole in dichloromethane. The resulting solution was cooled by a dry ice bath to −20° C. and a drop of boron trifluoride diethylether complex was added thereto from a syringe. Incidentally, the solution was heated to −10° C. and the viscosity thereof was increased by addition of boron trifluoride diethylether complex. Then, N-ethyl-3-vinylcarbazole in the solution was polymerized for approximately 15 minutes in the dry ice bath, to the solution was added 1 ml of concentrated aqueous ammonia to terminate the polymerization, and the resultant mixture was warmed to room temperature. The resultant mixture was dropped into 2 L of methanol to deposite a solid, and the solid was separated by filtration. The solid was washed with methanol and then subjected to vacuum drying using a desiccator to obtain 4.6 g of compound H-1. Thus-obtained compound H-1 had weight average molecular weight (Mw) of 24,000, which was determined by a gel permeation chromatography based on polystyrene standard.

2. Production of Light-Emitting Device and Measurement of Luminance

Examples 1 to 8 and Comparative Examples 1 to 6

A glass substrate of 25 mm×25 mm×0.7 mm in size having an ITO positive electrode of 150 nm in thickness, which is manufactured by Sanyo Vacuum Industries Co., Ltd., was subjected to etching and washing. The ITO positive electrode was spin-coated with poly[(3,4-ethylenedioxy)-2,5-thiophene]-polystyrene sulfonic acid aqueous dispersion ("Baytron P" manufactured by BAYER AG., solid contents: 1.3%) and vacuum-dried at 150° C. for 2 hours, to form a layer having a thickness of 100 nm. Then, this layer was spin-coated with a solution prepared by dissolving 40 mg of poly(N-vinylcarbazole) (PVK), 12 mg of 2-(4'-t-butylphenyl)-5-(4"-(phenyl)phenyl)-1,3,4-oxadiazole (PBD) and 10 mg of coumarin-6 in 3 ml of 1,2-dichloroethane to form a layer having a thickness of approximately 120 nm. Further, on thus-formed layer was disposed a mask patterned such that a light-emitting device has a light-emitting area of 5 mm×5 mm, magnesium and silver (magnesium/silver=10/1) was co-deposited thereon in a deposition apparatus to form a negative electrode having a thickness of 250 nm, and a protective layer having a thickness of 300 nm was disposed on the negative electrode by depositing silver, whereby a light-emitting device of Comparative Example 1 was produced.

Light-emitting devices of Comparative Examples 2 to 6 and Examples 1 to 8 were produced in the same manner as production of the light-emitting device of Comparative Example 1 except for using any one of known compounds P-1 to P-5 shown below and the compounds of the present invention H-1, H-3, H-5, H-8, H-10, H-12, H-16 and H-20 instead of PVK, respectively.

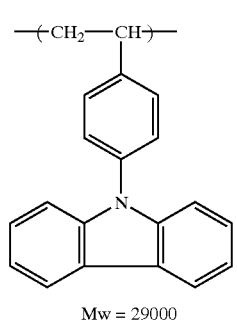

P-1

Mw = 29000

-continued

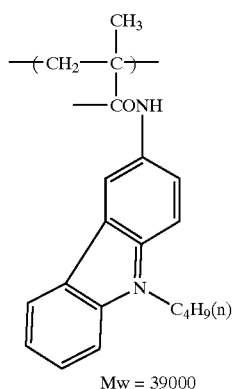

Mw = 39000

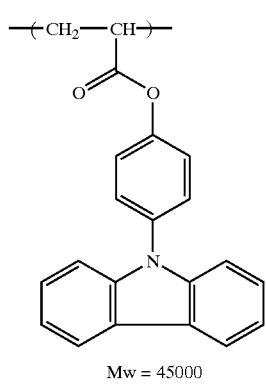

Mw = 45000

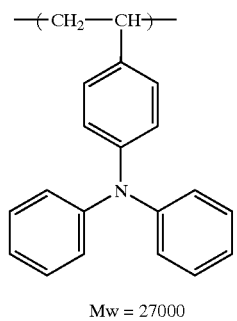

Mw = 27000

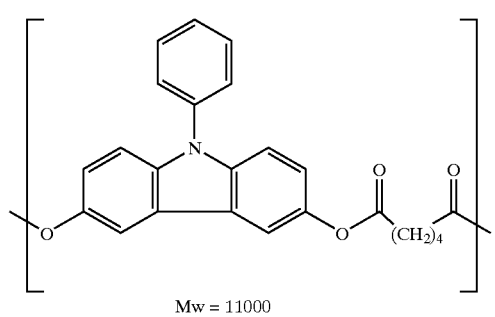

Mw = 11000

Each of thus-obtained light-emitting devices was made to emit light while applying direct current voltage thereto by "Source-Measure Unit 2400" manufactured by TOYO CORPORATION, and measured with respect to luminance by "Luminance Meter BM-8" manufactured by TOPCON CORPORATION. The compound used for each light-emitting device, luminance obtained when a direct current voltage of 18 V was applied to each device, and the maximum luminance of each device were shown in Table 1.

TABLE 1

| Light-Emitting Device | Compound | Luminance (at 18 V, cd/m$^2$) | Maximum Luminance (cd/m$^2$) |
|---|---|---|---|
| Comp. Ex. 1 | PVK | 1200 | 3800 |
| Comp. Ex. 2 | P-1 | 1300 | 3900 |
| Comp. Ex. 3 | P-2 | 1400 | 3700 |
| Comp. Ex. 4 | P-3 | 1300 | 3800 |
| Comp. Ex. 5 | P-4 | 1300 | 3700 |
| Comp. Ex. 6 | P-5 | 1200 | 3600 |
| Ex. 1 | H-1 | 2200 | 4700 |
| Ex. 2 | H-3 | 2100 | 4900 |
| Ex. 3 | H-5 | 2300 | 5000 |
| Ex. 4 | H-8 | 2200 | 4800 |
| Ex. 5 | H-10 | 2300 | 4900 |
| Ex. 6 | H-12 | 2100 | 4600 |
| Ex. 7 | H-16 | 2200 | 4700 |
| Ex. 8 | H-20 | 2300 | 4800 |

As shown in Table 1, the light-emitting devices of Examples 1 to 8 according to the present invention emitted light with high luminance as compared with the light-emitting devices of Comparative Examples 1 to 6.

Examples 9 to 16 and Comparative Examples 7 to 12

Light-emitting devices of Examples 9 to 16 and Comparative Examples 7 to 12 were produced in the same manner as production of the devices of Examples 1 to 8 and Comparative Examples 1 to 6 except for using Ir(ppy)$_3$ shown below, which utilizes a triplet exciton for light emission, in stead of coumarin-6, respectively.

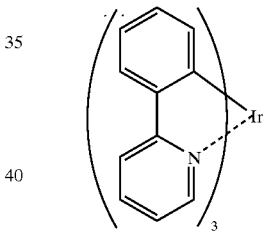

Each of thus-obtained light-emitting devices was made to emit light while applying direct current voltage thereto by "Source-Measure Unit 2400" manufactured by TOYO CORPORATION, and measured with respect to luminance by "Luminance Meter BM-8" manufactured by TOPCON CORPORATION. The compound used for each light-emitting device, luminance obtained when a direct current voltage of 18 V was applied to each device, and the maximum luminance of each device were shown in Table 2.

TABLE 2

| Light-Emitting Device | Compound | Luminance (at 18 V, cd/m$^2$) | Maximum Luminance (cd/m$^2$) |
|---|---|---|---|
| Comp. Ex. 7 | PVK | 4000 | 13000 |
| Comp. Ex. 8 | P-1 | 4200 | 12000 |
| Comp. Ex. 9 | P-2 | 4100 | 13000 |
| Comp. Ex. 10 | P-3 | 4000 | 12000 |
| Comp. Ex. 11 | P-4 | 4200 | 11000 |
| Comp. Ex. 12 | P-5 | 4100 | 13000 |
| Ex. 9 | H-1 | 6000 | 22000 |
| Ex. 10 | H-3 | 7000 | 25000 |
| Ex. 11 | H-5 | 7500 | 21000 |
| Ex. 12 | H-8 | 6700 | 20000 |

TABLE 2-continued

| Light-Emitting Device | Compound | Luminance (at 18 V, cd/m$^2$) | Maximum Luminance (cd/m$^2$) |
|---|---|---|---|
| Ex. 13 | H-10 | 7100 | 24000 |
| Ex. 14 | H-12 | 6800 | 25000 |
| Ex. 15 | H-16 | 6900 | 23000 |
| Ex. 16 | H-20 | 6800 | 24000 |

As shown in Table 2, the light-emitting devices of Examples 9 to 16 according to the present invention emitted light with high luminance as compared with the light-emitting devices of Comparative Examples 7 to 12. Additionally, comparing Examples 9 to 16 with Examples 1 to 8, it was clear that the light-emitting device of the present invention was further improved with respect to the light-emitting properties in the case of using the light-emitting material that utilizes a triplet exciton for light emission.

As described in detail above, the light-emitting device comprising the compound of the present invention can emit light with high luminance and excellent light-emitting efficiency.

What is claimed is:

1. A light-emitting device comprising a pair of electrodes and one or more organic layers disposed therebetween, wherein at least one of said organic layers comprises a compound represented by the following formula (2):

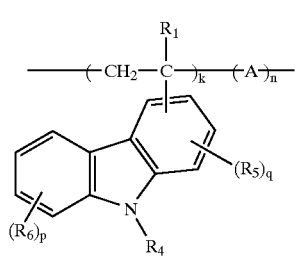

(2)

wherein R$_1$ represents a hydrogen atom or a methyl group; R$_4$ represents a hydrogen atom or a substituent selected from the group consisting of alkyl groups, alkenyl groups, alkynyl groups, aryl groups, heterocyclic groups, alkylcarbonyl groups, arylcarbonyl groups, alkylsulfoflyl groups, arylsulfonyl groups, alicoxycarbonyl groups, aryloxycarbonyl groups, carbamoyl groups and sulfamoyl groups; R$_5$ and R$_6$ independently represent a substituent; p represents an integer of 1 to 4; q represents an integer of 1 to 3; A represents a comonomer unit; and k and n independently represent a mole fraction, k being 1 to 100 (%), n being 0 to 99 (%), and the sum of k and n is 100 (%), wherein a carbon atom to which R$_1$ is attached is bonded to the 3- or 6-position of the carbazole ring in said compound represented by formula (2).

2. The light-emitting device according to claim 1, wherein said A is derived from a comonomer selected from the group consisting of styrene, α-methylstyrene, butadiene, vinyl acetate, vinyl carbazole, acrylic acid, methacrylic acid, acrylic esters, methacrylic esters, acrylamide and methacrylamide.

3. The light-emitting device according to claim 1, wherein said compound represented by the formula (2) has a weight-average molecular weight (Mw) of 1,000 to 10,000,000.

4. The light-emitting device according to claim 1, wherein said compound represented by the formula (2) has a weight ratio of 0.01 to 99.9 weight % based on the total weight of the organic layer comprising said compound.

5. The light-emitting device according to claim 1, wherein at least one of said organic layers is provided by a coating method.

6. The light-emitting device according to claim 1, wherein at least one of said organic layers comprises a light-emitting material that utilizes a triplet exciton for light emission.

7. The light-emitting device according to claim 6, wherein said light-emitting material is an iridium complex.

* * * * *